US011869590B2
US011869590B2

(12) United States Patent
Bicksler et al.

(10) Patent No.: US 11,869,590 B2
(45) Date of Patent: Jan. 9, 2024

(54) MEMORY DEVICES INCLUDING GATE LEAKAGE TRANSISTORS

(71) Applicant: MICRON TECHNOLOGY, INC., Boise, ID (US)

(72) Inventors: Andrew Bicksler, Nampa, ID (US); Marc Aoulaiche, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 17/458,954

(22) Filed: Aug. 27, 2021

(65) Prior Publication Data

US 2023/0065743 A1 Mar. 2, 2023

(51) Int. Cl.
*G11C 16/04* (2006.01)
*G11C 16/16* (2006.01)
*H10B 41/27* (2023.01)
*H10B 41/35* (2023.01)
*H10B 43/27* (2023.01)
*H10B 43/35* (2023.01)

(52) U.S. Cl.
CPC .......... *G11C 16/0483* (2013.01); *G11C 16/16* (2013.01); *H10B 41/27* (2023.02); *H10B 41/35* (2023.02); *H10B 43/27* (2023.02); *H10B 43/35* (2023.02)

(58) Field of Classification Search
CPC .... G11C 16/0483; G11C 16/16; H10B 41/27; H10B 41/35; H10B 43/27; H10B 43/35

USPC ................................................... 365/185.17
See application file for complete search history.

(56) References Cited

U.S. PATENT DOCUMENTS

| 6,262,926 | B1 * | 7/2001 | Nakai | G11C 16/08 365/201 |
| 7,133,313 | B2 * | 11/2006 | Shih | G11C 16/0466 365/185.24 |
| 8,902,657 | B2 * | 12/2014 | Iwai | G11C 16/0483 365/185.11 |
| 2014/0369127 | A1 * | 12/2014 | Hara | G11C 16/26 365/185.17 |

* cited by examiner

*Primary Examiner* — Tha-O H Bui
(74) *Attorney, Agent, or Firm* — Dicke, Billig & Czaja, PLLC

(57) ABSTRACT

A memory device includes a string of series-connected memory cells, a data line, a first select transistor, a common source, a second select transistor, and a gate leakage transistor. The string of series-connected memory cells includes a vertical channel region. Each memory cell of the string of series-connected memory cells includes a first gate stack structure. The data line is connected to the vertical channel region. The first select transistor is connected between the data line and the string of series-connected memory cells. The second select transistor is connected between the common source and the string of series-connected memory cells. The gate leakage transistor is connected between the first select transistor and the second select transistor. The gate leakage transistor includes a second gate stack structure different from the first gate stack structure.

25 Claims, 18 Drawing Sheets

MEMORY DEVICES INCLUDING GATE LEAKAGE TRANSISTORS

TECHNICAL FIELD

The present disclosure relates generally to memory and, in particular, in one or more embodiments, the present disclosure relates to gate leakage transistors within memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

DETAILED DESCRIPTION

Figure 1:
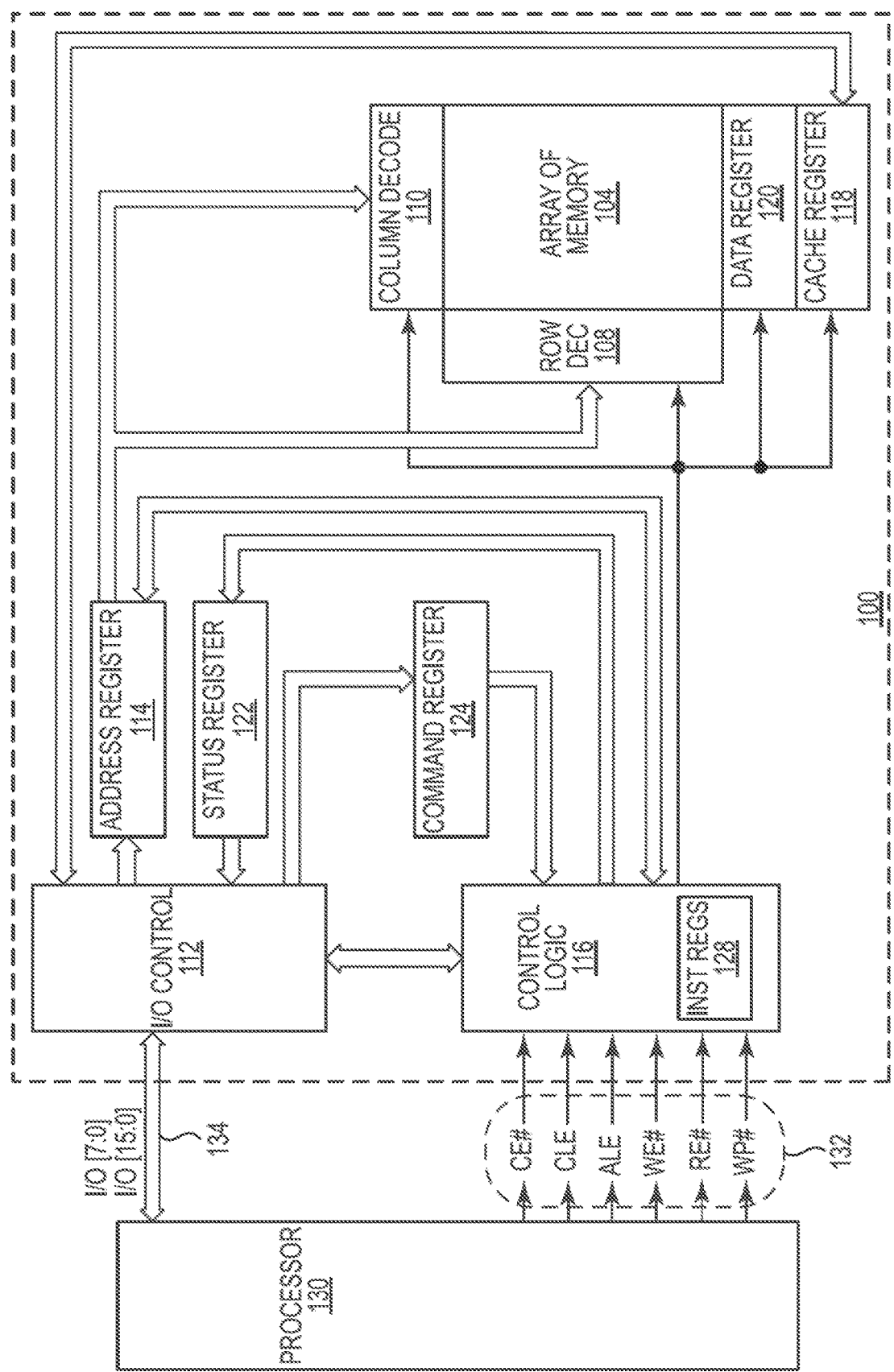
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
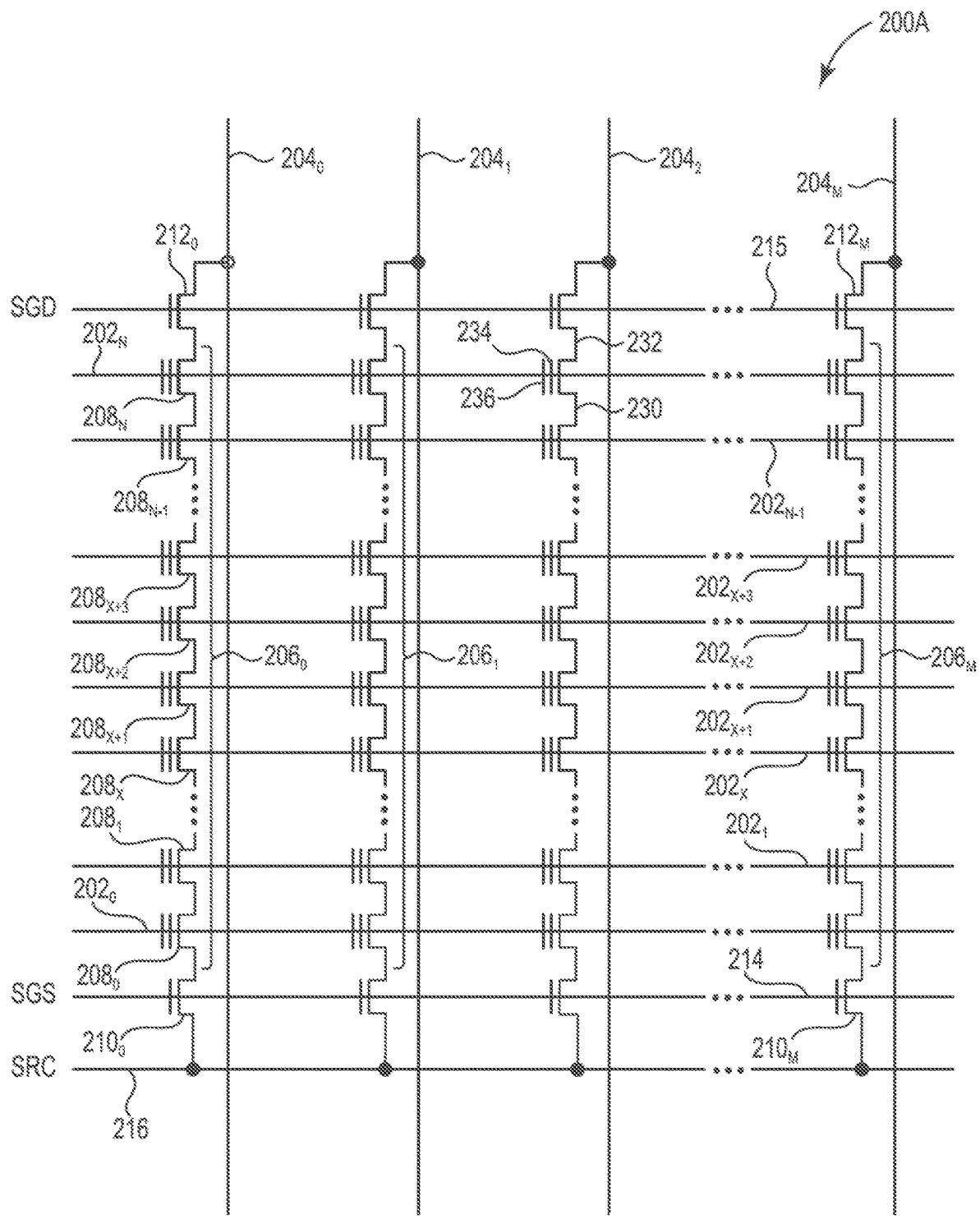
FIGS. 2A and 2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
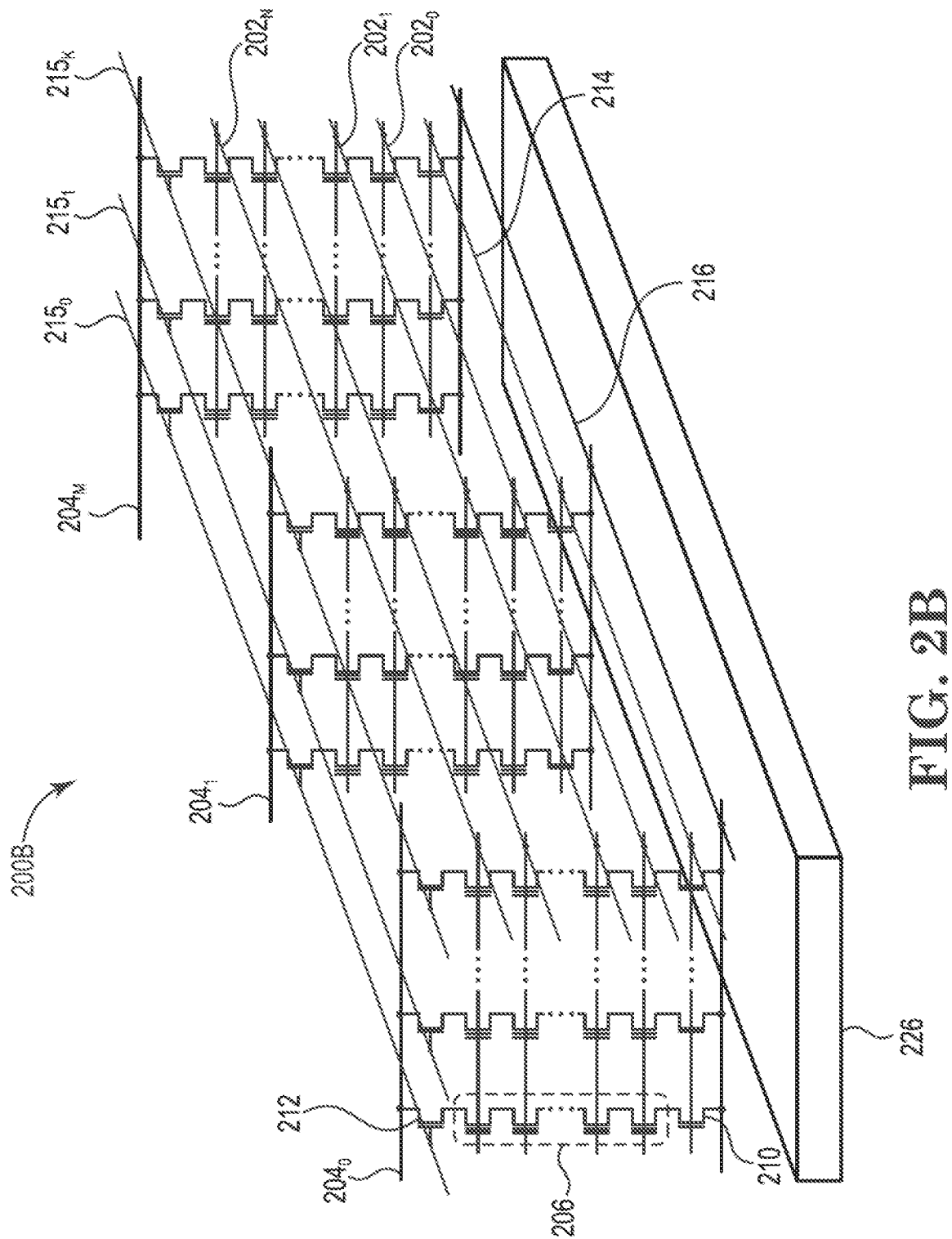

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

With the access lines 202 turned off, a pillar acting as a channel region might be isolated from the common source 216 via a source junction (e.g., n+ junction) and isolated from a corresponding bit line 204 due to a drain junction (e.g., n+ junction). Junction leakage might be used to charge the pillar to a positive value during an erase operation when an erase bias is applied to the common source 216 and the corresponding bit line 204. To use junction leakage to charge the pillar, the source junction and/or the drain junction might be designed for high ON current, low OFF current during reading and programming operations, and high OFF current during erase operations. Source Gate Source (SGS) Gate Induced Drain Leakage (GIDL) might be difficult to achieve due to significant upward diffusion from the source. In addition, Source Gate Drain (SGD) GIDL might be optimized with other OFF current operations (e.g., read and program operations). Accordingly, as disclosed herein, leakage through the gate oxide of a gate leakage transistor might be utilized to charge the pillar during an erase operation. Leakage through the gate oxide of the gate leakage transistor might allow the source junction and/or the drain junction to be optimized for OFF current for read and program operations. The gate leakage transistor may be placed anywhere between a bit line and a common source, such as within a string of series-connected memory cells.

The gate leakage transistor might allow hole tunneling from the gate of the gate leakage transistor to the channel region during erase operations with minimal leakage during read and program operations. The gate leakage transistor might include a polysilicon (e.g., p+ doped) gate for hole injection. The gate leakage transistor might include a barrier-engineered gate stack to provide hole injection from the gate in response to higher electric fields during erase operations and provide low leakage in response to lower electric fields during read and program operations.

Figure 3:
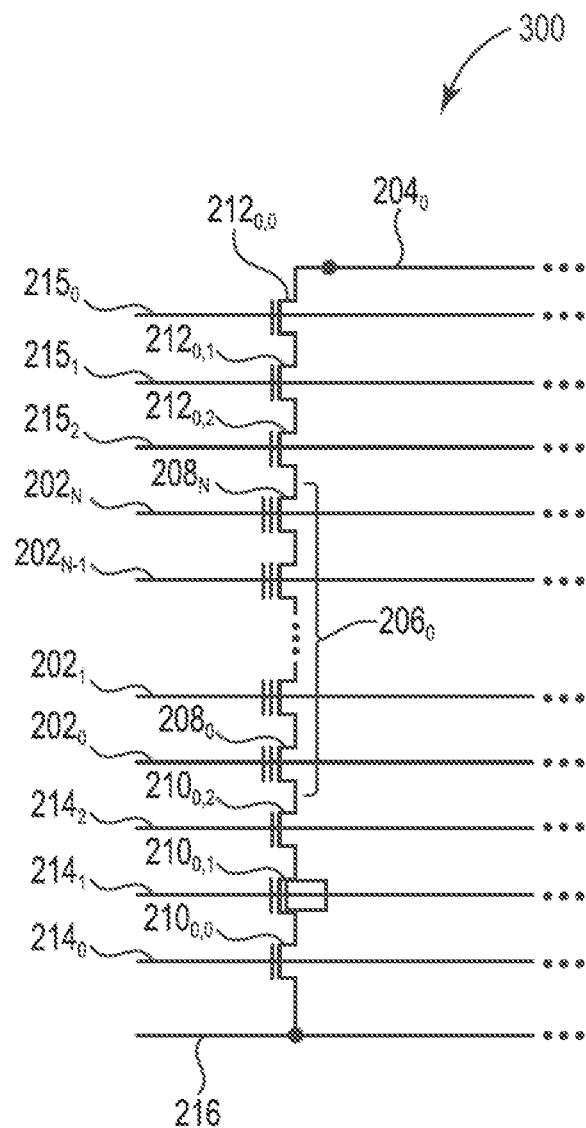
FIG. 3 is a schematic of a portion of an array of memory cells as could be used in the memory of the type described with reference to FIG. 1.

FIG. 3 is a schematic of a portion of an array of memory cells 300 as could be used in the memory of the type described with reference to FIG. 1, e.g., as a portion of array of memory cells 104. Like numbered elements in FIG. 3 correspond to the description as provided with respect to FIGS. 2A and 2B. FIG. 3 provides additional detail of one example of a three-dimensional NAND memory array structure. The three-dimensional NAND memory array 300 might further include for each data line 204, three source select transistors 210 and three drain select transistors 212. For example, memory array 300 includes for data line $204_O$ and string of series-connected memory cells $206_0$, select gates $210_{0,0}$ to $210_{0,2}$ and select gates $212_{0,0}$ to $212_{0,2}$.

The memory cells 208 of each NAND string 206 might be connected in series between select gates 210 (e.g., field-effect transistors), such as select gates $210_{0,0}$ to $210_{0,2}$, and select gates 212 (e.g., field-effect transistors), such as select gates $212_{0,0}$ to $212_{0,2}$. Select gates $210_{0,0}$ to $210_{0,2}$ might each be connected to a select line $214_0$ to $214_2$, respectively, such as source select lines (SGSs), and select gates $212_{0,0}$ to $212_{0,2}$ might each be connected to a select line $215_O$ to $215_2$, respectively, such as drain select lines (SGDs). The select gates $210_{0,0}$ to $210_{0,2}$ are connected in series, and the select gates $212_{0,0}$ to $212_{0,2}$ are connected in series.

A source of select gate $210_{0,0}$ might be connected to common source 216. The drain of select gate $210_{0,2}$ might be connected to a memory cell $208_0$ of the corresponding NAND string $206_0$. Therefore, each select gate $210_{0,0}$ to $210_{0,2}$ might be configured to selectively connect a corresponding NAND string $206_0$ to common source 216. A control gate of each select gate $210_{0,0}$ to $210_{0,2}$ might be connected to select line $214_0$ to $214_2$, respectively.

The drain of select gate $212_{0,0}$ might be connected to the data line $204_0$ for the corresponding NAND string $206_0$. The source of select gate $212_{0,2}$ might be connected to a memory cell $208_N$ of the corresponding NAND string $206_0$. Therefore, each select gate $212_{0,0}$ to $212_{0,2}$ might be configured to selectively connect a corresponding NAND string $206_0$ to the corresponding data line $204_0$. A control gate of each select gate $212_{0,0}$ to $212_{0,2}$ might be connected to select line $215_0$ to $215_2$, respectively.

At least one of select gates $210_{0,1}$ and $210_{0,2}$ might be a gate leakage transistor, and/or at least one of select gates $212_{0,1}$ and $212_{0,2}$ might be a gate leakage transistor. For example, a first select transistor (e.g., $212_{0,0}$) might be connected between a data line (e.g., $204_0$) and a string of series-connected memory cells (e.g., $206_0$). As described in more detail below, the string of series-connected memory cells might have a first gate stack structure. A second select transistor (e.g., $210_{0,0}$) might be connected between a common source (e.g., 216) and the string of series-connected memory cells (e.g., $206_0$). A gate leakage transistor (e.g., $210_{0,1}$ and/or $212_{0,1}$) might be connected between the first select transistor (e.g., $212_{0,0}$) and the second select transistor (e.g., $210_{0,0}$). As described in more detail below, the gate leakage transistor (e.g., $210_{0,1}$ and/or $212_{0,1}$) might include a second gate stack structure different from the first gate stack structure.

Figure 4A:
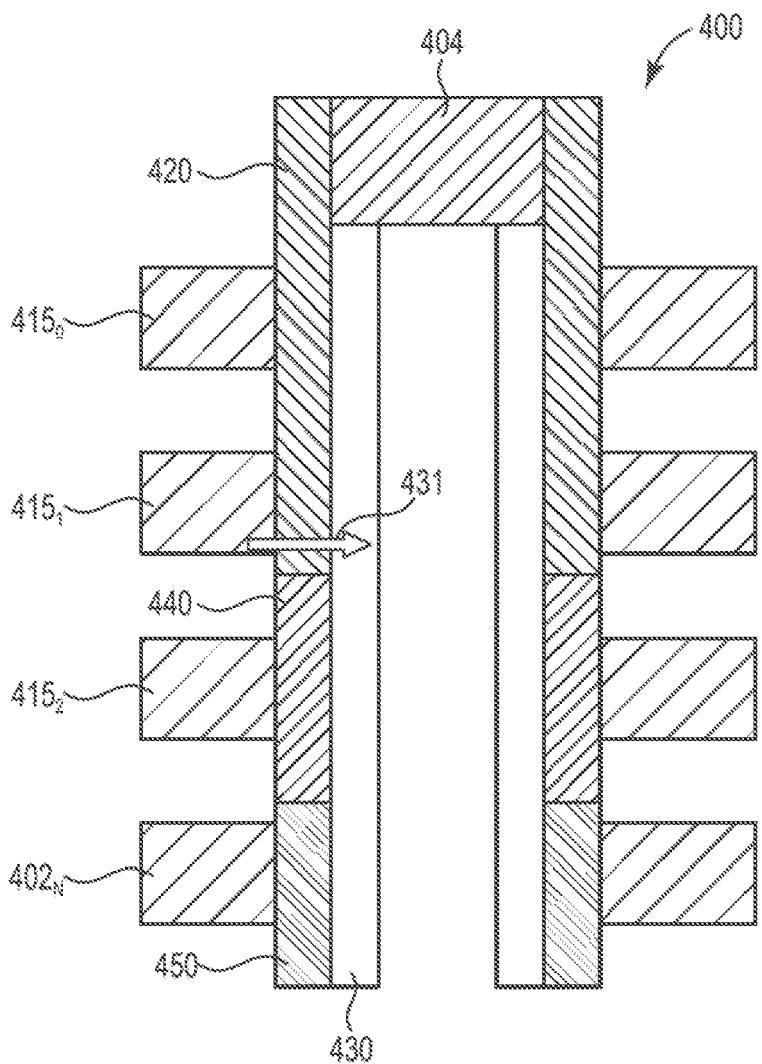
FIGS. 4A-4D are cross-sectional views illustrating the structure of a portion of an array of memory cells according to embodiments.
Figure 4B:
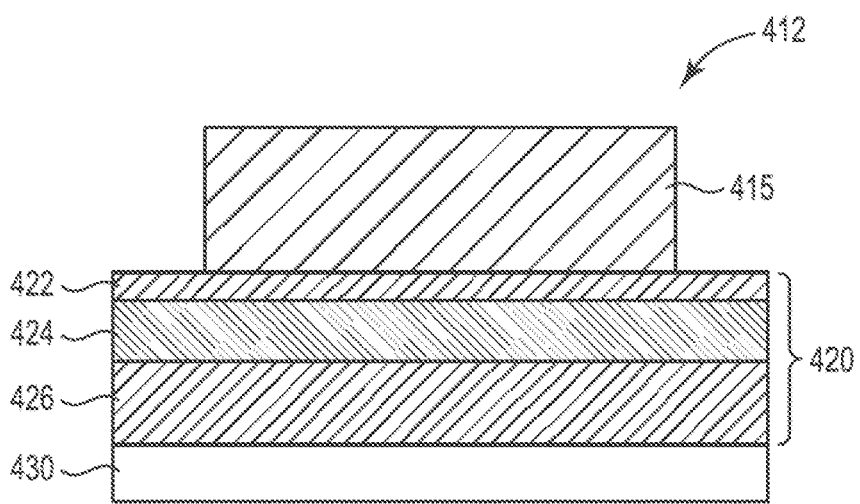
Figure 4C:
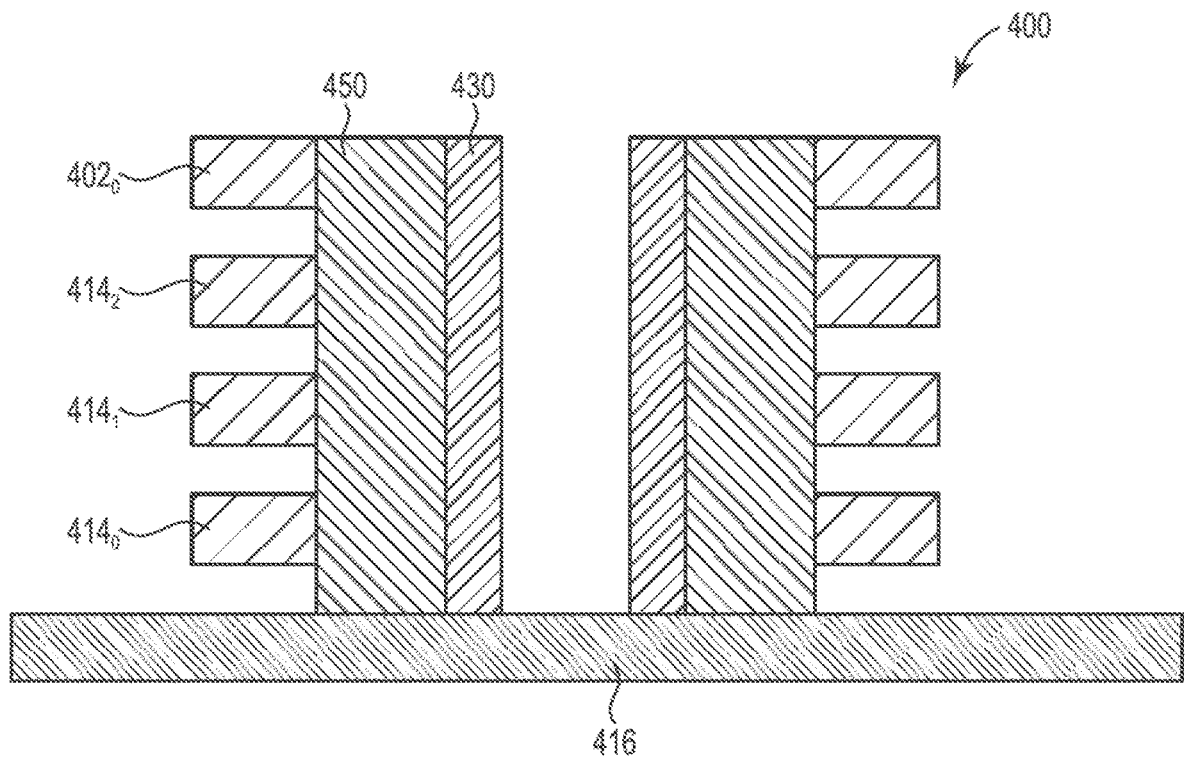

FIGS. 4A-4C illustrate cross-sectional views of the structure of a portion of an array of memory cells 400 according to embodiments. FIG. 4A illustrates an upper portion of the array of memory cells 400 including a contact 404, select gates $415_0$ to $415_2$, an access line $402_N$, a gate stack 420, a gate stack 440, a gate stack 450, and a vertical channel region 430 (e.g., semiconductor pillar). The vertical channel region 430 might be a hollow channel region. A data line might be connected to the contact 404. The contact 404 (e.g., an n+ polysilicon plug) is connected to the vertical channel region 430 (e.g., doped polysilicon). Select gate $415_0$, gate stack 420, and vertical channel region 430 might provide a select transistor, such as drain select transistor $212_{0,0}$ of FIG.

3. Select gate $415_1$, gate stack 420, and vertical channel region 430 might provide a select transistor, such as drain select transistor $212_{0,1}$ of FIG. 3. This drain select transistor might be a gate leakage transistor. The gate leakage transistor might be configured to have a first leakage in response to a first electric field and a second leakage less than the first leakage in response to a second electric field less than the first electric field.

Select gate $415_2$, gate stack 440, and vertical channel region 430 might provide a select transistor, such as drain select transistor $212_{0,2}$ of FIG. 3. Access line $402_N$, gate stack 450, and vertical channel region 430 might provide a memory cell, such as memory cell $208_N$ of FIG. 3. The gate stack 420 might include a barrier-engineered gate stack structure, the gate stack 440 might include a silicon dioxide gate stack structure or a barrier-engineered gate stack structure, and the gate stack 450 might include a replacement gate stack structure.

FIG. 4B illustrates a select transistor 412, which might provide the select transistor of select gate $415_0$, gate stack 420, and vertical channel region 430 and/or of select gate $415_1$, gate stack 420, and vertical channel region 430 of FIG. 4A. Select transistor 412 might include a polysilicon (e.g., p+ doped) gate 415, a gate stack 420 including an oxide layer 422, a nitride layer 424, and an oxide layer 426, and the channel region 430. The gate stack 420 might include a barrier-engineered gate stack structure.

FIG. 4C illustrates a lower portion of the array of memory cells 400 including a common source 416, select gates $414_0$ to $414_2$, an access line $402_0$, the gate stack 450, and the vertical channel region 430. The common source 416 is connected to the vertical channel region 430. Select gate $414_0$, gate stack 450, and vertical channel region 430 might provide a select transistor, such as source select transistor $210_{0,0}$ of FIG. 3. Select gate $414_1$, gate stack 450, and vertical channel region 430 might provide a select transistor, such as source select transistor $210_{0,1}$ of FIG. 3. Select gate $414_2$, gate stack 450, and vertical channel region 430 might provide a select transistor, such as source select transistor $210_{0,2}$ of FIG. 3. Access line $402_0$, gate stack 450, and vertical channel region 430 might provide a memory cell, such as memory cell $208_0$ of FIG. 3.

Figure 4D:
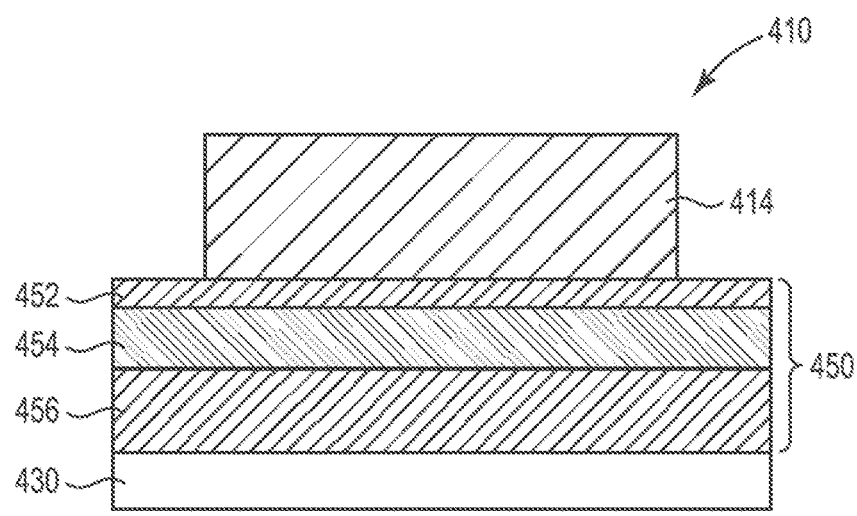

FIG. 4D illustrates a select transistor 410, which might provide a select transistor of select gates $414_0$ to $414_2$, gate stack 450, and vertical channel region 430 and/or a memory cell of access lines $402_0$ to $402_N$, gate stack 450, and vertical channel region 430 of FIGS. 4A and 4C. Select transistor 410 might include a metal gate 414, a gate stack 450 including an oxide layer 452, a nitride layer 454, and an oxide layer 456, and the channel region 430. The gate stack 450 might include a replacement gate stack structure. In other embodiments, the replacement gate stack structure 450 might include an oxide, nitride, oxide, nitride, oxide stack structure.

Referring to FIGS. 3-4D, the memory array 300 or 400 might include a string of series-connected memory cells (e.g., $206_0$) connected between a data line (e.g., $204_0$) and a common source (e.g., 216 or 416), and a semiconductor pillar providing a channel region (e.g., 430) of the string of series-connected memory cells. A first select transistor (e.g., $212_{0,0}$ or $415_0/420/430$) might be connected between the data line and the string of series-connected memory cells. A second select transistor (e.g., $210_{0,0}$ or $414_0/450/430$) might be connected between the common source and the string of series-connected memory cells. A gate leakage transistor (e.g., $212_{0,1}$ or $415_1/420/430$) might be connected between the first select transistor and the second select transistor. The gate leakage transistor might be configured to inject holes from a gate of the gate leakage transistor to the channel region during an erase operation of the string of series-connected memory cells as indicated by arrow 431. In some embodiments, a further gate leakage transistor (e.g., $210_{0,1}$) might be connected between the first select transistor and the second select transistor. The further gate leakage transistor might be configured to inject holes from a gate of the further gate leakage transistor to the channel region during the erase operation of the string of series-connected memory cells. The semiconductor pillar providing the channel region might be connected to the data line via a contact (e.g., 404) including an n-type conductively-doped polysilicon. In some embodiments, the semiconductor pillar providing the channel region might include polysilicon. In addition, the semiconductor pillar providing the channel region might be hollow.

Figure 5A:
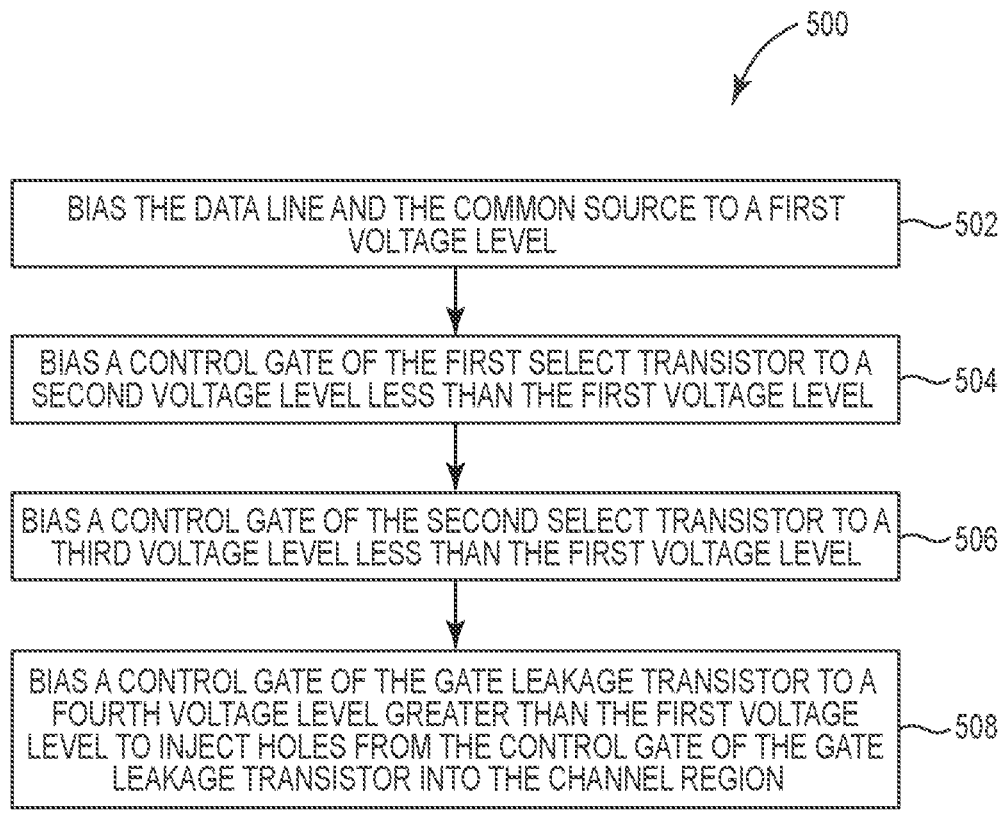
FIGS. 5A and 5B are flowcharts of a method of operating a memory in accordance with an embodiment.
Figure 5B:
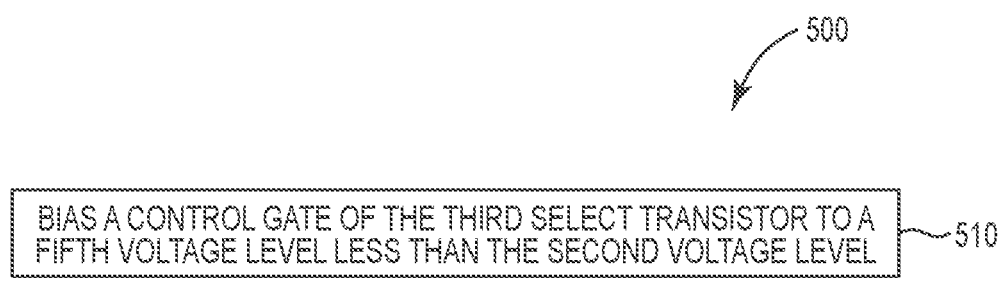

FIGS. 5A and 5B are flowcharts of a method 500 of operating a memory in accordance with an embodiment. Method 500 may correspond at least in part to FIGS. 3-4D. For example, FIGS. 5A and 5B might represent a method for leakage assisted erase operations of a string of series-connected memory cells. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 500 might be implemented within a memory device (e.g., 100) including an array of memory cells (e.g., 104) and a controller (e.g., 116) configured to access the array of memory cells as previously described at least with reference to FIGS. 1-2B. The memory device might include a string of series-connected memory cells (e.g., $206_0$) including a vertical channel region (e.g., 430), a data line (e.g., $204_0$) connected to the vertical channel region via a contact (e.g., 404), and common source (e.g., 216 or 416). A control gate of each memory cell of the string of series-connected memory cells might be connected to an access line (e.g., $202_0$ to $202_N$ or $402_0$ to $402_N$). A first select transistor (e.g., $212_{0,0}$ or $415_0/420/430$) might be connected between the data line and the string of series-connected memory cells. A second select transistor (e.g., $210_{0,0}$ or $414_0/450/430$) might be connected between the common source and the string of series-connected memory cells. A gate leakage transistor (e.g., $212_{0,1}$ or $415_1/420/430$) might be connected between the first select transistor and the second select transistor. Each memory cell of the string of series-connected memory cells might include a first gate stack structure (e.g., 450). The gate leakage transistor might include a second gate stack structure (e.g., 420) different from the first gate stack structure. In some embodiments, the gate leakage transistor might be directly connected to the first select transistor. A third select transistor (e.g., $212_{0,2}$ or $415_2/440/430$) might be connected between the gate leakage transistor and the string of series-connected memory cells.

In this embodiment, as illustrated in FIG. 5A at 502, for an erase operation, the controller may bias the data line and the common source to a first voltage level (e.g., an erase voltage, such as 20V). The controller may bias each access line to 0V. At 504, the controller may bias a control gate of the first select transistor to a second voltage level (e.g., the erase voltage minus 2V) less than the first voltage level. At 506, the controller may bias a control gate of the second select transistor to a third voltage level (e.g., the erase voltage minus 9V) less than the first voltage level. At 508, the controller may bias a control gate of the gate leakage transistor to a fourth voltage level (e.g., the erase voltage plus 7V) greater than the first voltage level to inject holes from the control gate of the gate leakage transistor into the channel region. As illustrated in FIG. 5B at 510, the controller may further bias a control gate of the third select transistor to a fifth voltage level (e.g., the erase voltage minus 4V) less than the second voltage level. The third voltage level might be less than the second voltage level, and the fifth voltage level might be between the second voltage level and the third voltage level.

Figure 6A:
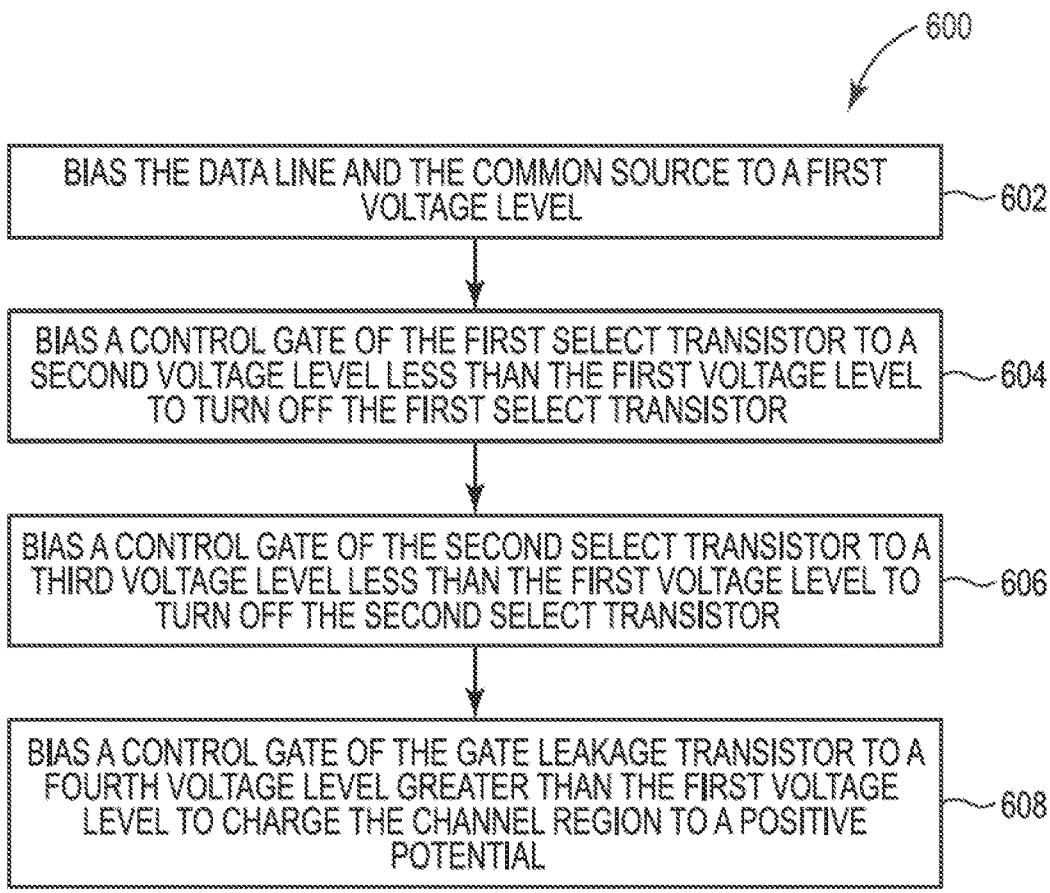
FIGS. 6A and 6B are flowcharts of a method of operating a memory in accordance with another embodiment.
Figure 6B:
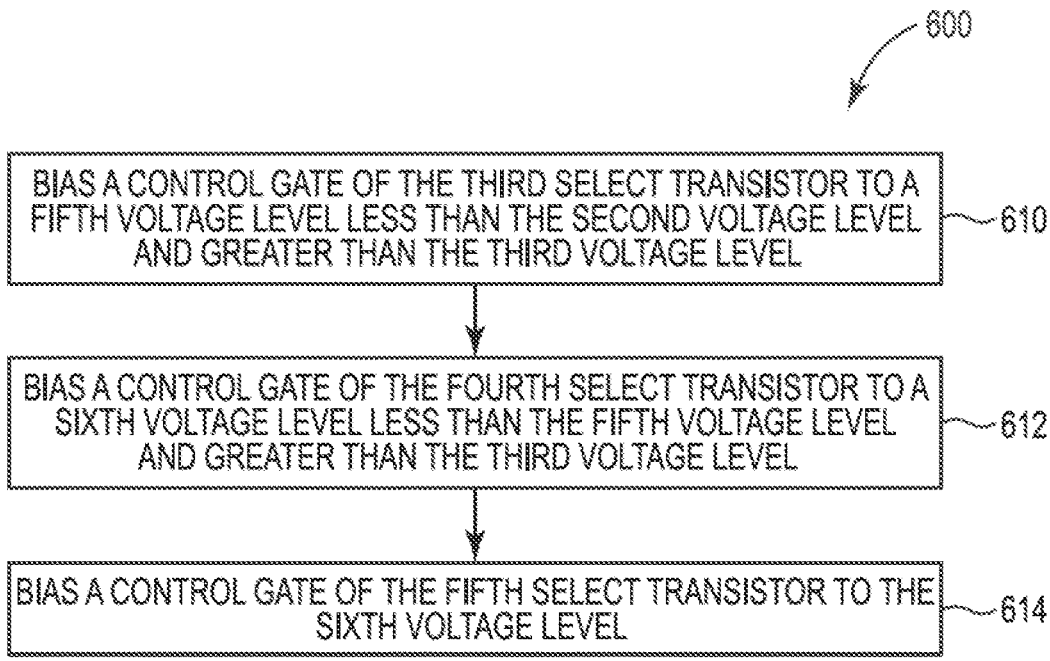

FIGS. 6A and 6B are flowcharts of a method 600 of operating a memory in accordance with another embodiment. Method 600 may correspond at least in part to FIGS. 3-4D. For example, FIGS. 6A and 6B might represent a method for leakage assisted erase operations of a string of series-connected memory cells. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 600 might be implemented within a memory device (e.g., 100) including an array of memory cells (e.g., 104) and a controller (e.g., 116) configured to access the array of memory cells as previously described at least with reference to FIGS. 1-2B. The memory device might include a string of series-connected memory cells (e.g., $206_0$) connected between a data line (e.g., $204_0$) and a common source (e.g., 216 or 416), and including a channel region (e.g., 430). A control gate of each memory cell of the string of series-connected memory cells might be connected to an access line (e.g., $202_0$ to $202_N$ or $402_0$ to $402_N$). A first select transistor (e.g., $212_{0,0}$ or $415_0/420/430$) might be connected between the data line and the string of series-connected memory cells. A second select transistor (e.g., $210_{0,0}$ or $414_0/450/430$) might be connected between the common source and the string of series-connected memory cells. A gate leakage transistor (e.g., $212_{0,1}$ or $415_1/420/430$) might be connected between the first select transistor and the second select transistor. In some embodiments, a third select transistor (e.g., $212_{0,2}$ or $415_2/440/430$) might be connected between the gate leakage transistor and the string of series-connected memory cells. A fourth select transistor (e.g., $210_{0,1}$ or $414_1/450/430$) might be connected between the second select transistor and the string of series-connected memory cells. A fifth select transistor (e.g., $210_{0,2}$ or $414_2/450/430$) might be connected between the fourth select transistor and the string of series-connected memory cells. In some embodiments, the gate leakage transistor might include a barrier-engineered gate stack structure, each memory cell of the string of series-connected memory cells might include a replacement gate stack structure, the first select transistor might include the barrier-engineered gate stack structure, the second select transistor might include the replacement gate stack structure, the third select transistor might include the barrier-engineered gate stack structure, the fourth select transistor might include the replacement gate stack structure, and the fifth select transistor might include the replacement gate stack structure.

In this embodiment, as illustrated in FIG. 6A at 602, for an erase operation, the controller may bias the data line and the common source to a first voltage level (e.g., an erase voltage, such as 20V). The controller may bias each access line to 0V. At 604, the controller may bias a control gate of the first select transistor to a second voltage level (e.g., the erase voltage minus 2V) less than the first voltage level to turn off the first select transistor. At 606, the controller may bias a control gate of the second select transistor to a third voltage level (e.g., the erase voltage minus 9V) less than the first voltage level to turn off the second select transistor. At 608, the controller may bias a control gate of the gate leakage transistor to a fourth voltage level (e.g., the erase voltage plus 7V) greater than the first voltage level to charge the channel region to a positive potential.

As illustrated in FIG. 6B at 610, the controller may further bias a control gate of the third select transistor to a fifth voltage level (e.g., the erase voltage minus 4V) less than the second voltage level and greater than the third voltage level. At 612, the controller may further bias a control gate of the fourth select transistor to a sixth voltage level (e.g., the erase voltage minus 6V) less than the fifth voltage level and greater than the third voltage level. At 614, the controller may further bias a control gate of the fifth select transistor to the sixth voltage level.

Figure 7A:
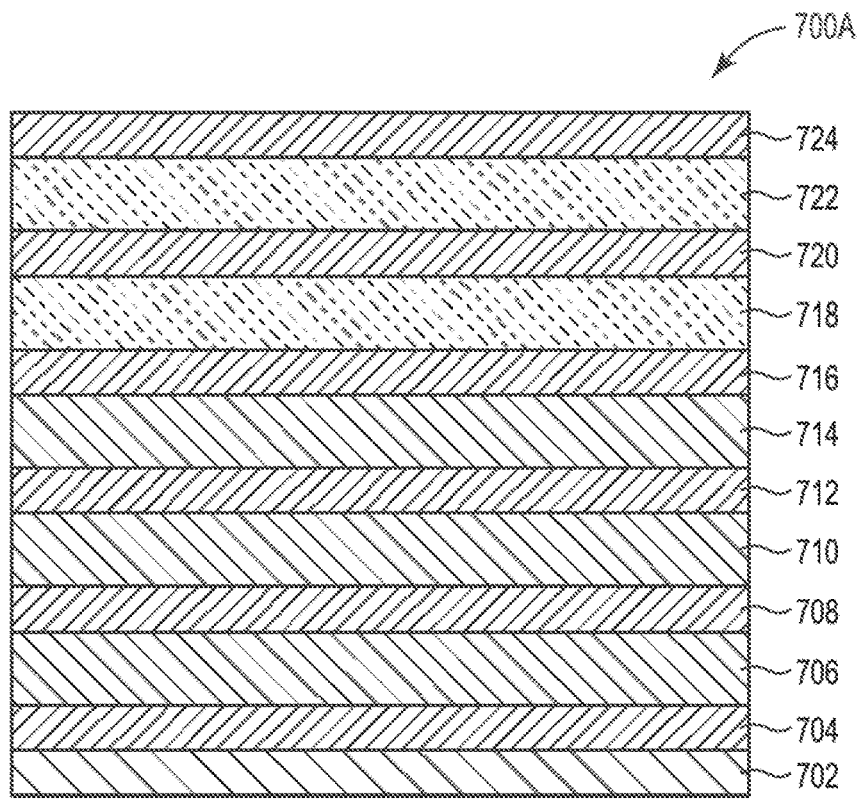
FIGS. 7A-7R are cross-sectional views illustrating a method for fabricating a memory array according to embodiments.
Figure 7B:
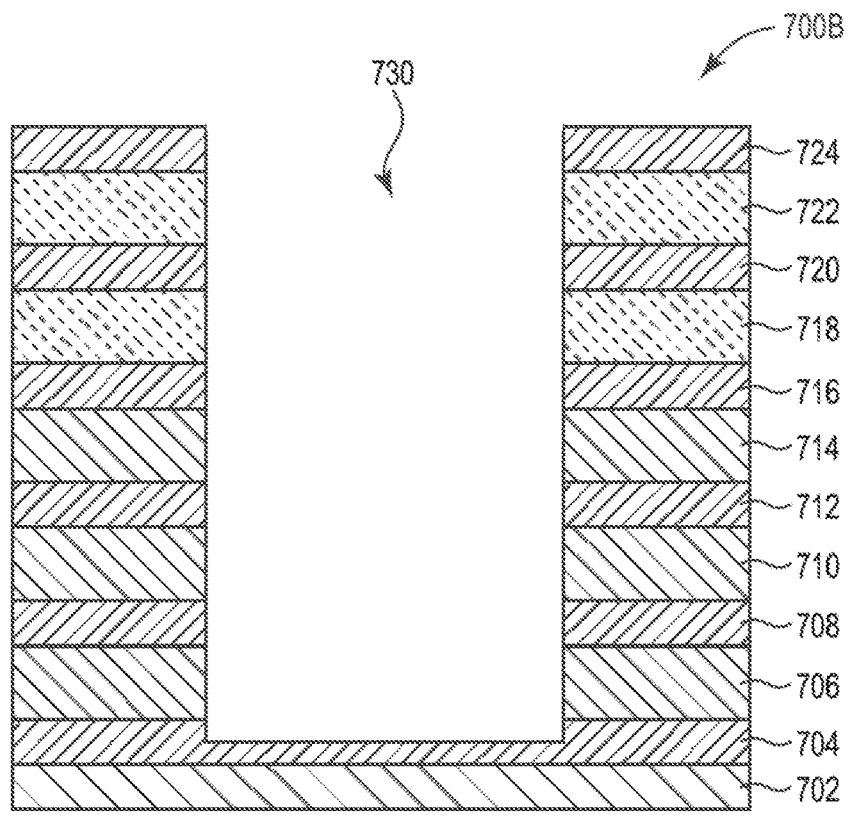
Figure 7C:
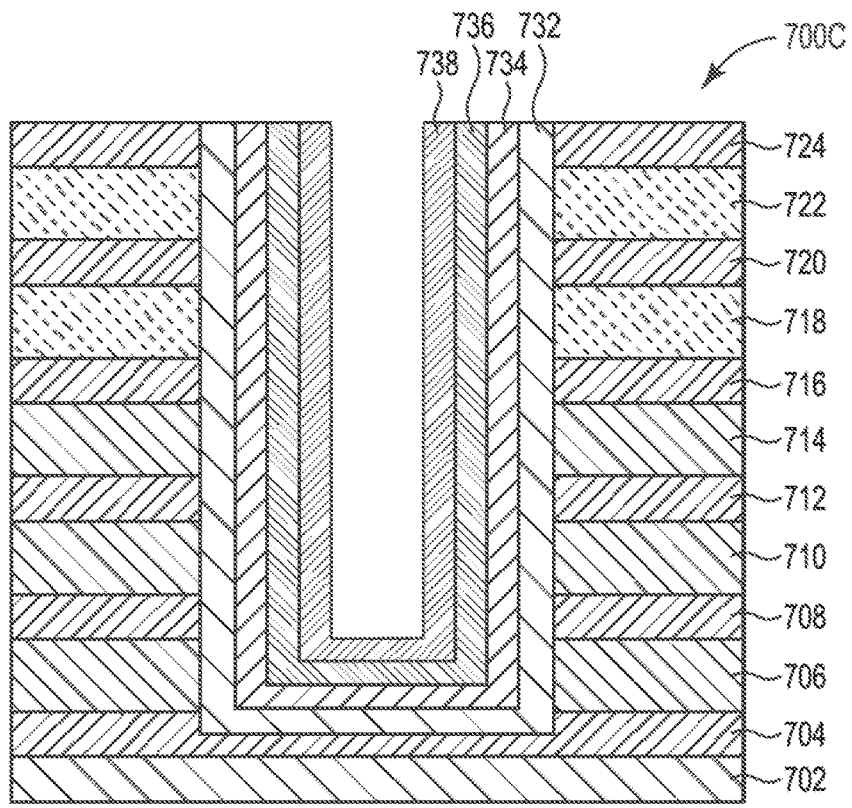
Figure 7D:
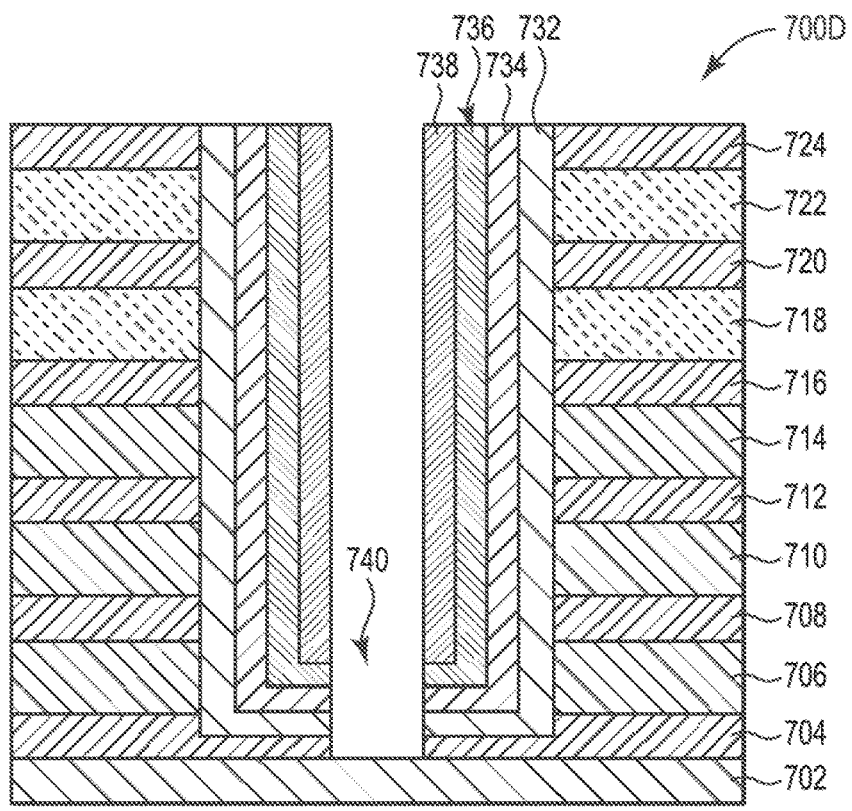
Figure 7E:
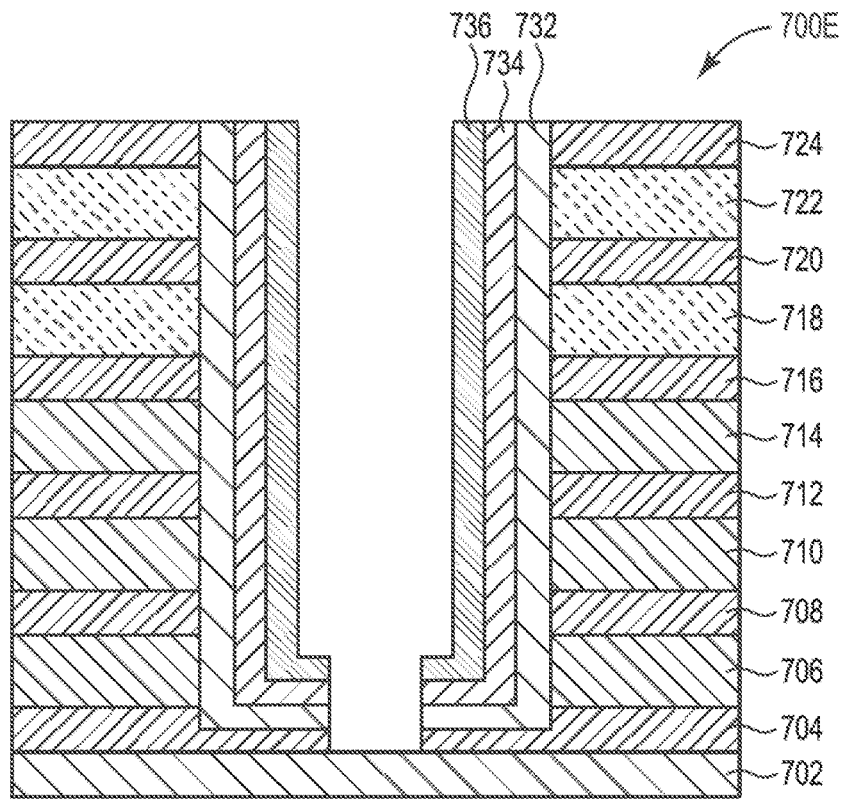
Figure 7F:
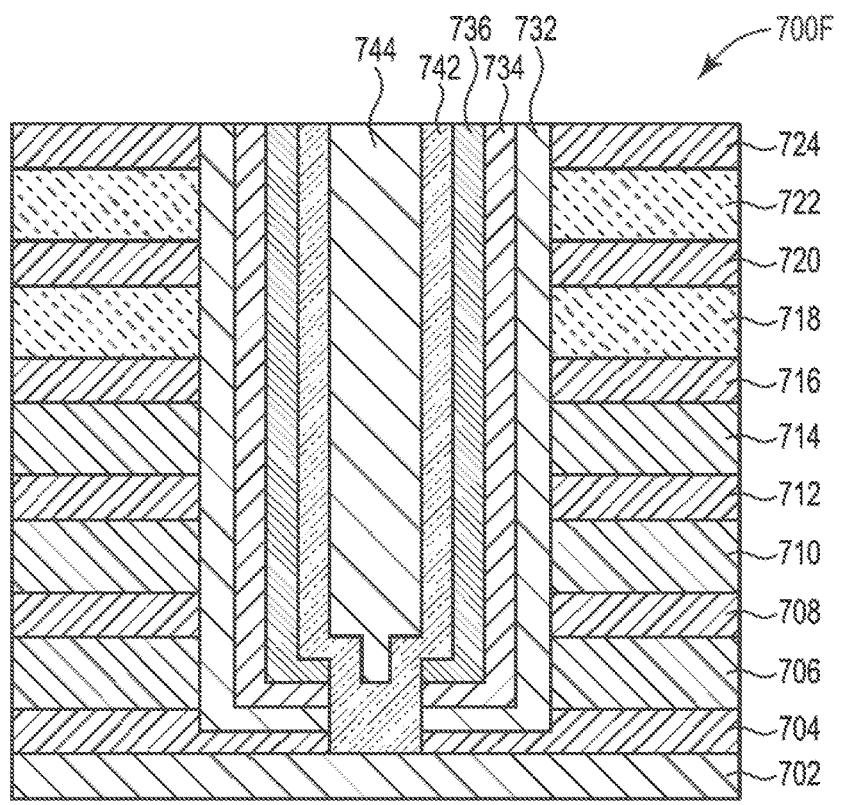
Figure 7G:
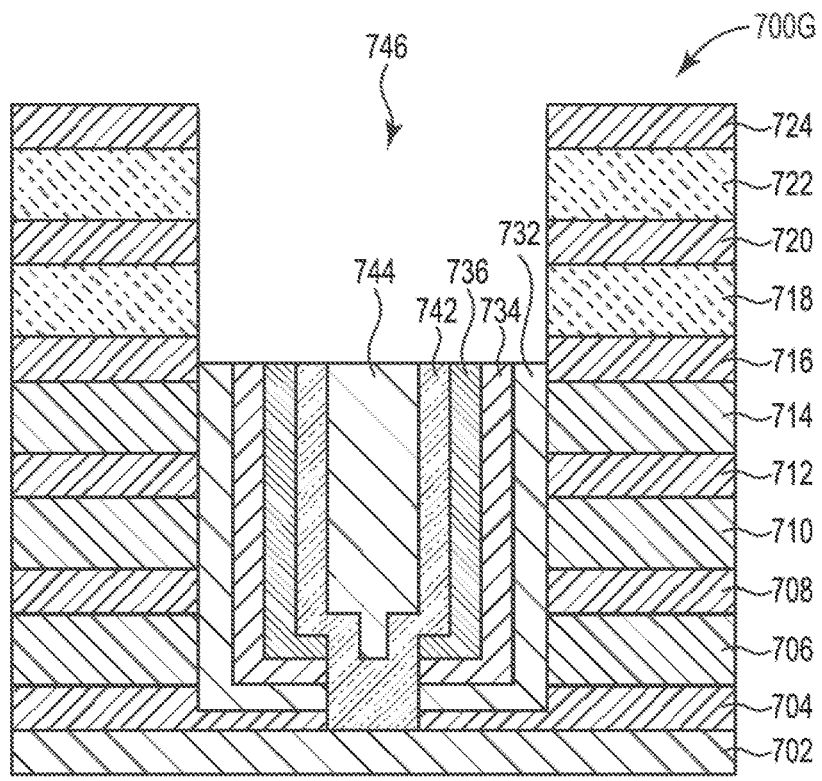
Figure 7H:
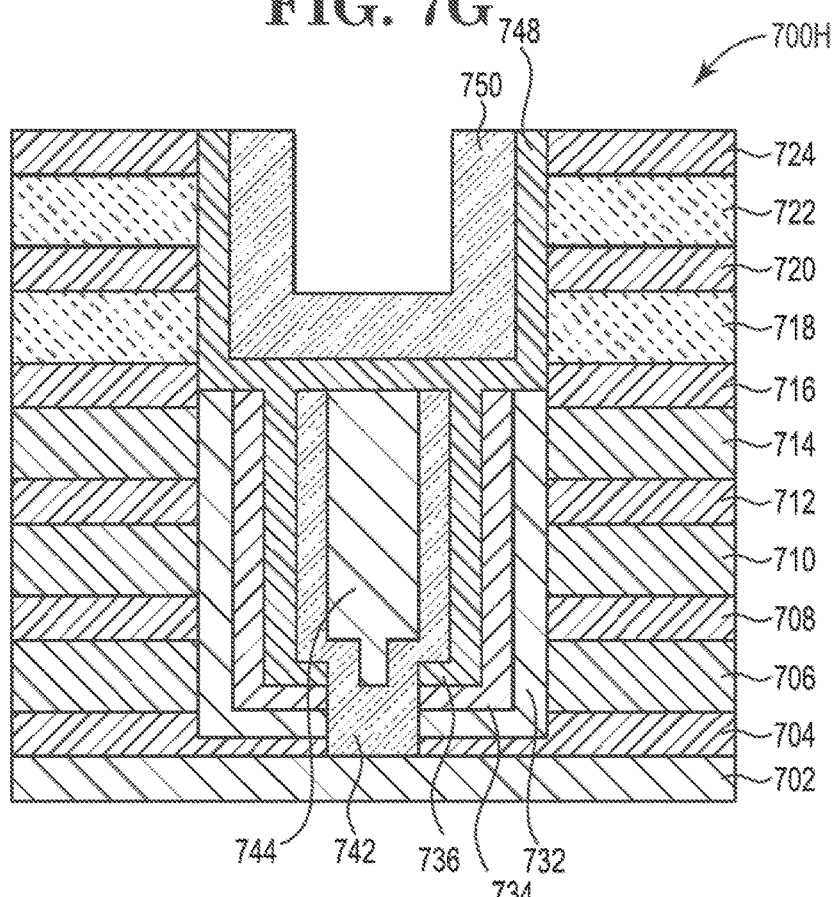
Figure 7I:
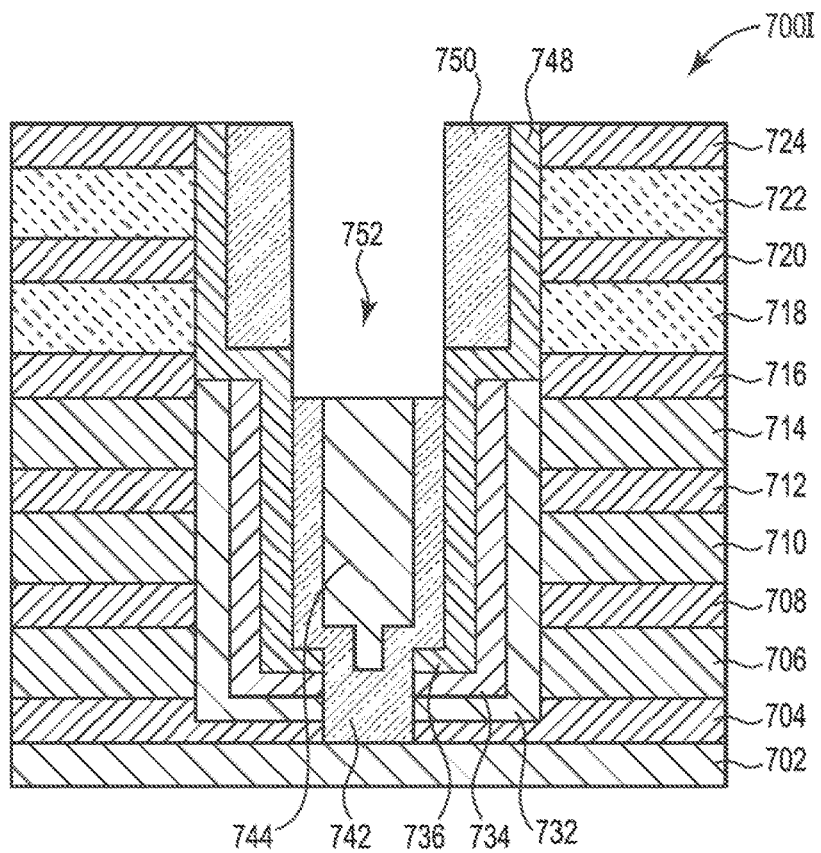
Figure 7J:
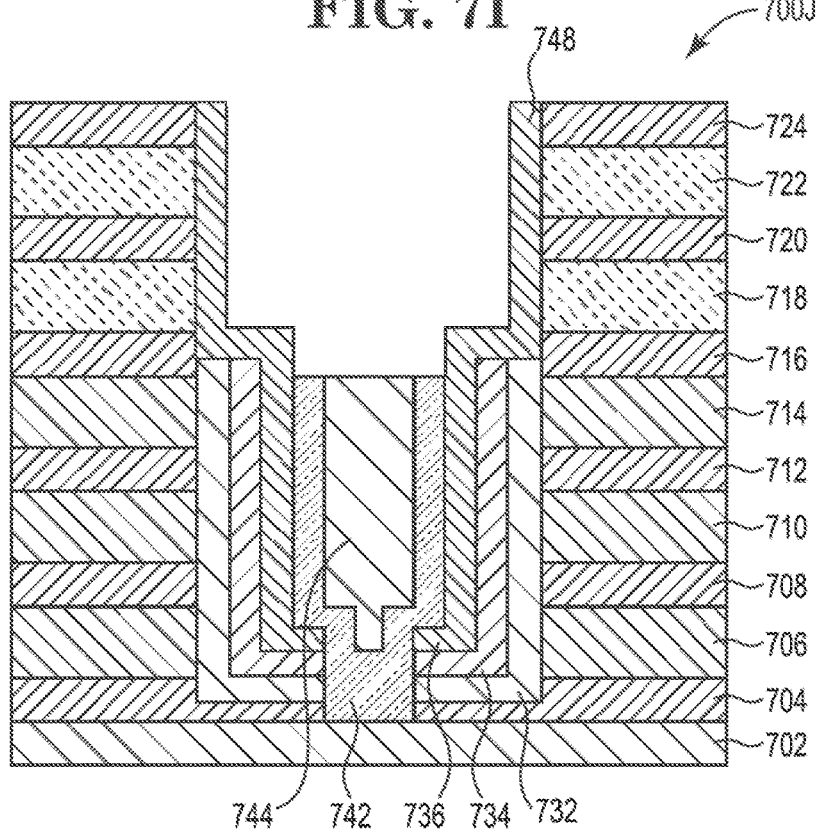
Figure 7K:
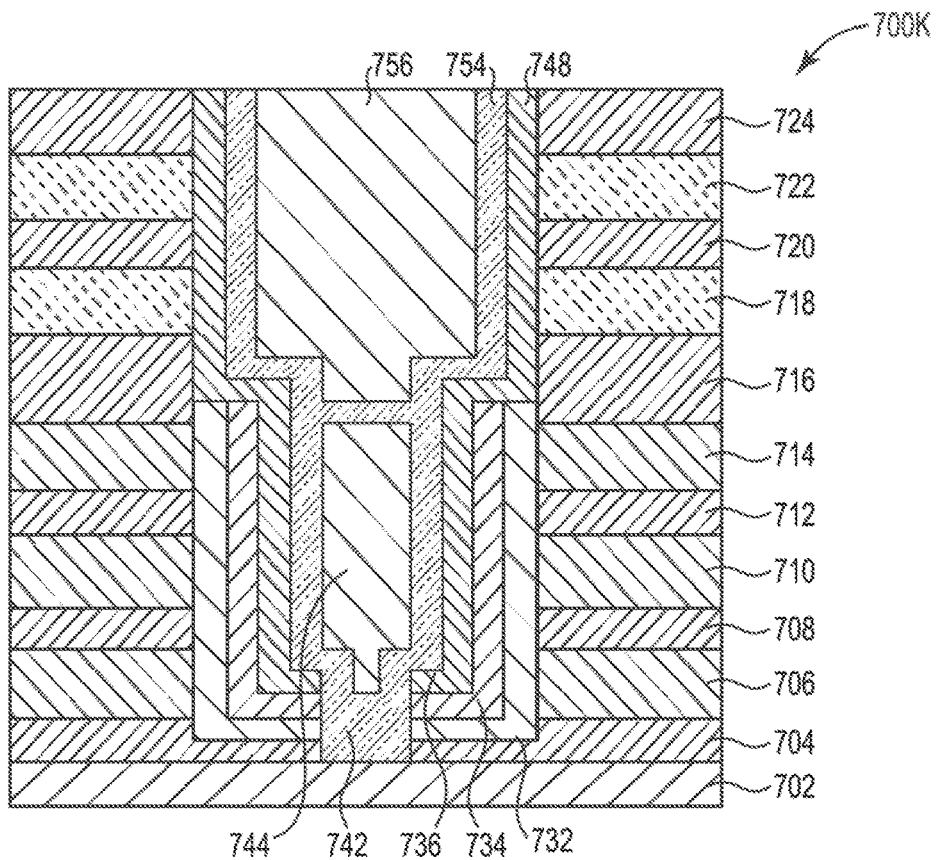
Figure 7L:
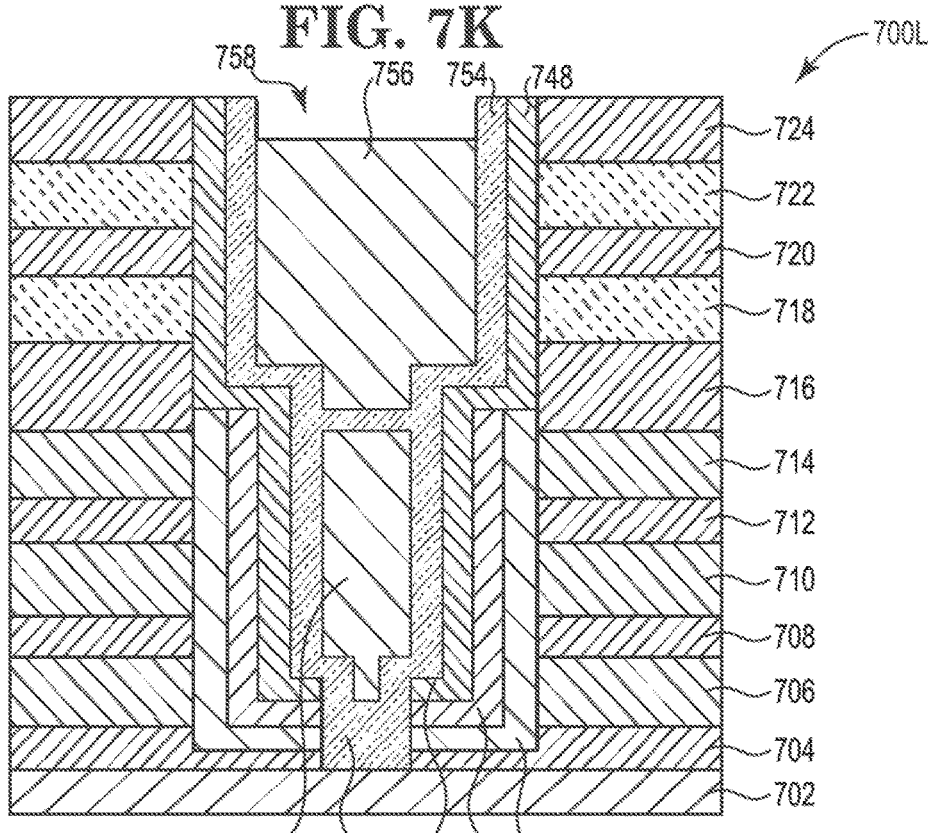
Figure 7M:
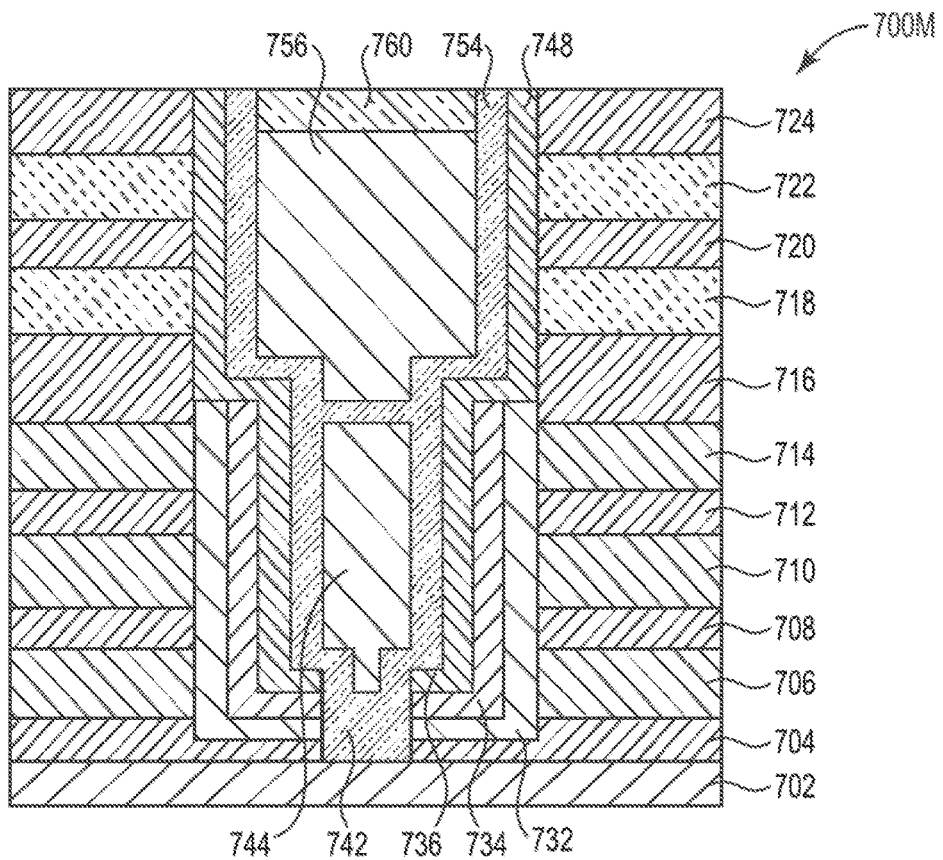
Figure 7N:
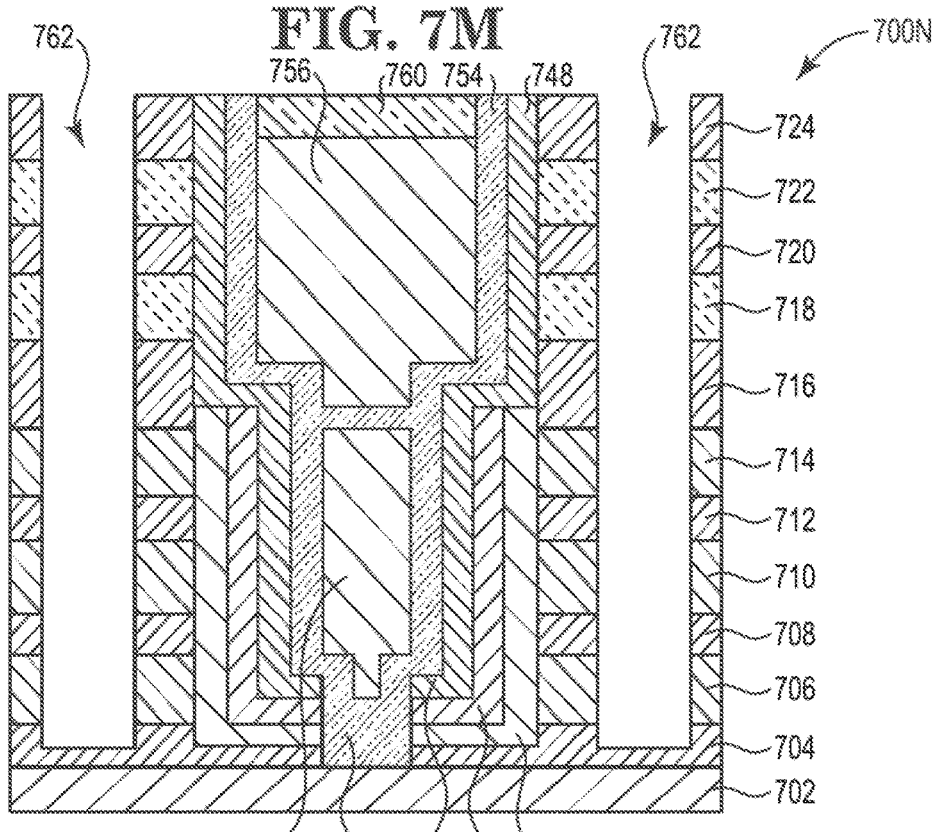
Figure 7O:
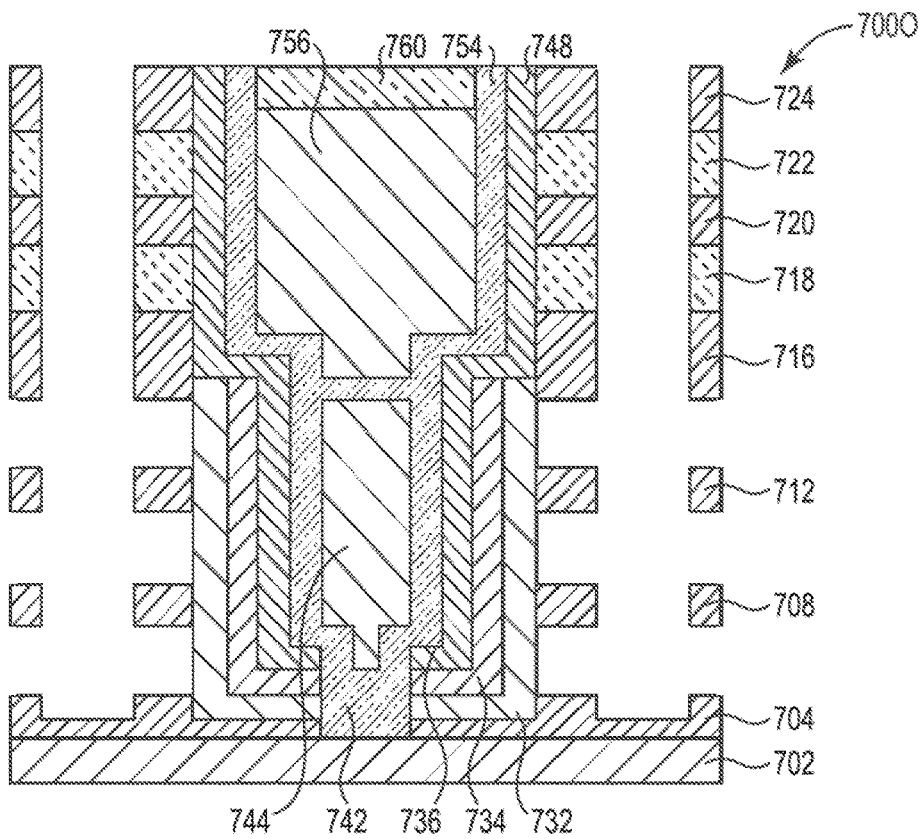
Figure 7P:
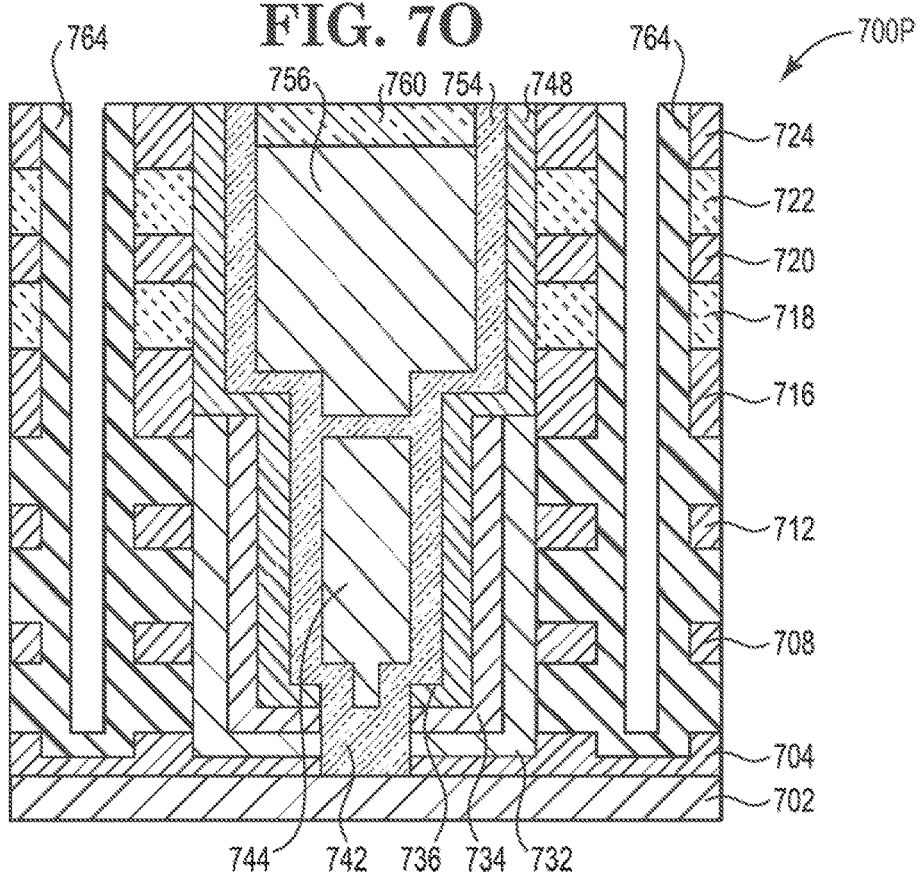
Figure 7Q:
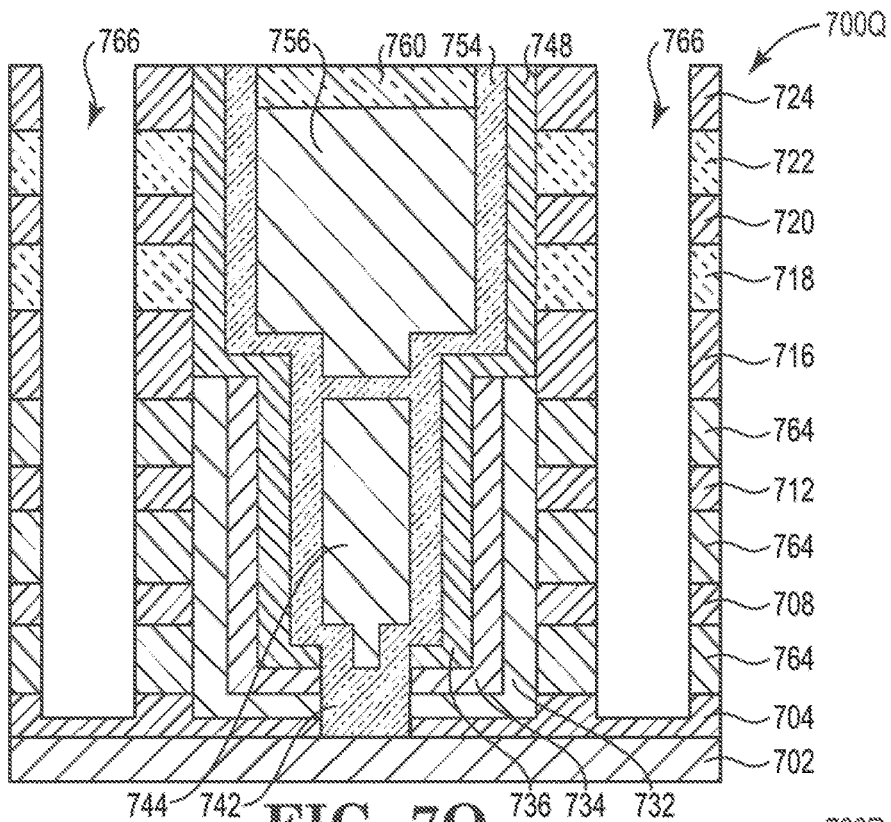
Figure 7R:
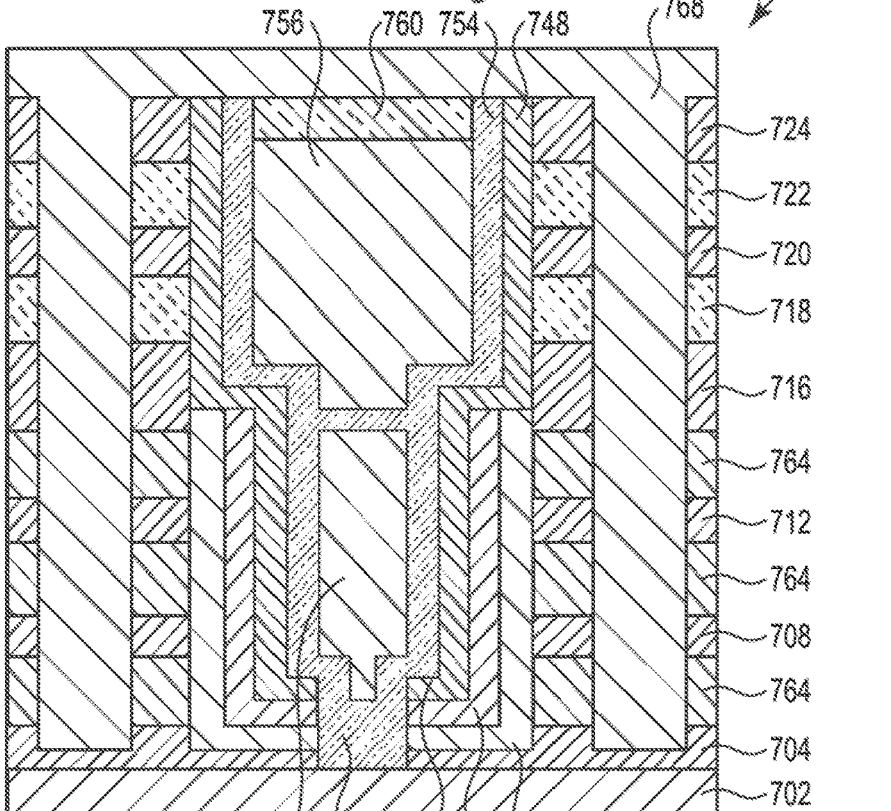

FIGS. 7A-7R illustrate a method for fabricating a memory array according to embodiments. As illustrated at 700A in FIG. 7A, a plurality of layers might be deposited on a source material layer 702. A tier oxide layer 704 might be deposited on the source material layer 702. A tier nitride layer 706 might be deposited on the tier oxide layer 704. A tier oxide layer 708 and a tier nitride layer 710 might be respectively deposited on the tier nitride layer 706. A plurality of additional tier oxide layers and tier nitride layers (not shown) might be respectively deposited on the tier nitride layer 710. A tier oxide layer 712 and a tier nitride layer 714 might be respectively deposited on the top of the plurality of additional tier oxide layers and tier nitride layers. The number of tier oxide layers and tier nitride layers might be based on the number of transistors (e.g., memory cells and select gates) using gate stack 450 of FIGS. 4A and 4C. An oxide layer 716 might be deposited on the tier nitride layer 714. A polysilicon (e.g., p+ doped) layer 718 might be deposited on the oxide layer 716. An oxide layer 720 might be deposited on the polysilicon layer 718. A polysilicon (e.g., p+ doped) layer 722 might be deposited on the oxide layer 720. An oxide layer 724 might be deposited on the polysilicon layer 722.

As illustrated at 700B in FIG. 7B, layers 704, 706, 708, 710, 712, 714, 716, 718, 720, 722, and 724 might be etched to form an opening as indicated at 730 for a pillar, stopping in or below the tier dielectric layer 704. As illustrated at 700C in FIG. 7C, a blocking dielectric layer 732 (e.g., $SiO_2$ and/or a high-k dielectric, such as $AlO_x$) might be deposited on the walls and floor of the opening 730. A storage layer 734 (e.g., $Si_3N_4$) might be deposited on the blocking dielectric layer 732 within the opening. A tunneling dielectric layer 736 (e.g., $SiO_2$, oxynitride, $Si_3N_4$, or a combination thereof) might be deposited on the storage layer 734 within the opening. A punch layer (e.g., polysilicon) 738 might be deposited on the tunneling dielectric layer 736 within the opening. As illustrated at 700D in FIG. 7D, a punch etch might be used to etch the punch layer 738, the tunneling dielectric layer 736, the storage layer 734, the blocking dielectric layer 732, and the tier oxide layer 704 at the bottom of the opening to expose the source material layer 702 as indicated at 740.

As illustrated at 700E in FIG. 7E, the punch layer 738 might be removed (e.g., via a wet etch). As illustrated at 700F in FIG. 7F, a channel material 742 (e.g., polysilicon) might be deposited within the opening on the tunneling dielectric layer 736 and on source material layer 702 to connect to the source material layer. A dielectric material 744 might be deposited on the channel material 742 to fill the opening. As illustrated at 700G in FIG. 7G, the dielectric material 744, the channel material 742, the tunneling dielectric layer 736, the storage layer 734, and the blocking dielectric layer 732 might be etched back (e.g., via a dry and/or wet etch) to form an opening as indicated at 746 exposing the polysilicon layers 718 and 722. As illustrated at 700H in FIG. 7H, a dielectric layer(s) (e.g., ONO) 748 might be deposited on the walls and floor of the opening 746. A punch layer 750 might be deposited on the dielectric layer(s) 748 within the opening.

As illustrated at 700I in FIG. 7I, a punch etch might be used to etch the punch layer 750 and the dielectric layer(s) 748 as indicated at 752. As illustrated at 700J in FIG. 7J, the punch layer 750 might be removed (e.g., via a wet etch). As illustrated at 700K in FIG. 7K, a channel material 754 might be deposited on the walls and floor of the opening to contact the channel material 742. The channel material 742 and 754 might be referred to as a semiconductor pillar. A dielectric material 756 might be deposited on the channel material 754 to fill the opening. As illustrated at 700L in FIG. 7L, the dielectric material 756 might be etched back to form an opening as indicated at 758. As illustrated at 700M in FIG. 7M, a polysilicon (e.g., n+ doped) 760 might be deposited on the dielectric material 756 to fill the opening 758.

As illustrated at 700N in FIG. 7N, the layers 704, 706, 708, 710, 712, 714, 716, 718, 720, 722, and 724 might be etched to form openings as indicated at 762 for a replacement gate process. As illustrated at 700O in FIG. 7O, the tier nitride layers 706, 710, and 714 might be removed. As illustrated at 700P in FIG. 7P, a metal 764 might be deposited to form gates where the tier nitride layers 706, 710, and 714 were removed. In some embodiments, an additional charge blocking layer (not shown) might be deposited in the void created by removing the tier nitride layers 706, 710, and 714 prior to depositing the metal 764. As illustrated at 700Q in FIG. 7Q, the metal 764 might be etched (e.g., via a dry and/or wet etch) as indicated at 766 to isolate the gates. As illustrated at 700R in FIG. 7R, a dielectric 768 might be deposited to fill the openings. After 700R, contacts might be formed to the gates formed by polysilicon 718 and 722 and metal 764 to complete the fabrication of the array of memory cells.

Figure 8A:
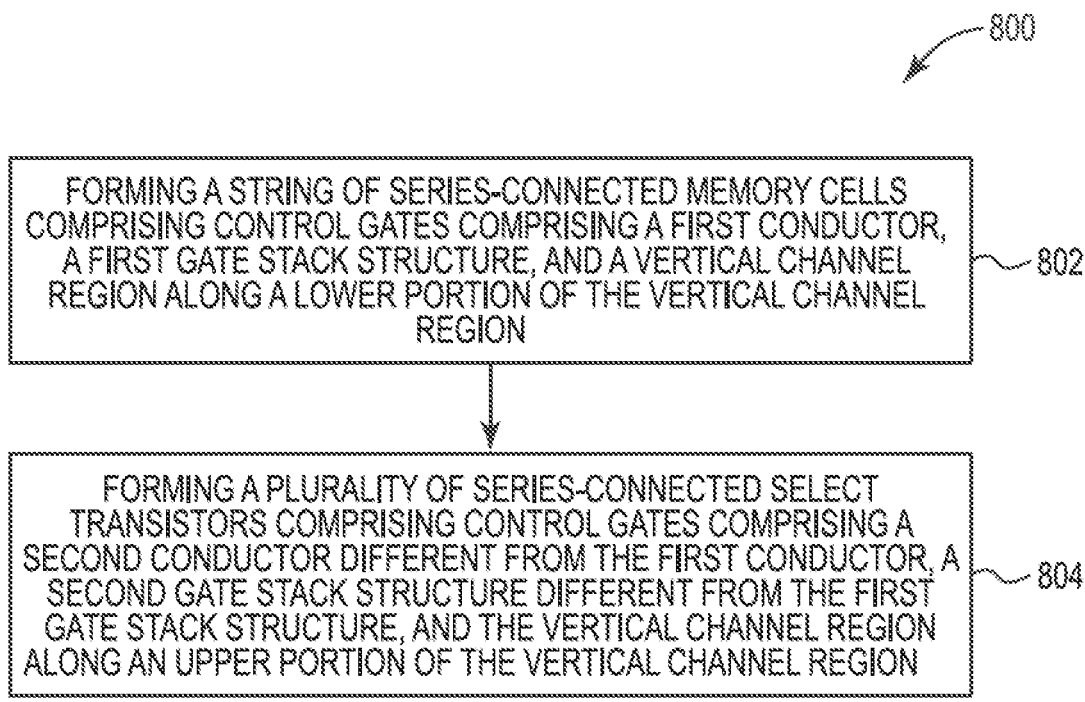
FIGS. 8A and 8B are flowcharts of a method of fabricating a memory array in accordance with embodiments.
Figure 8B:
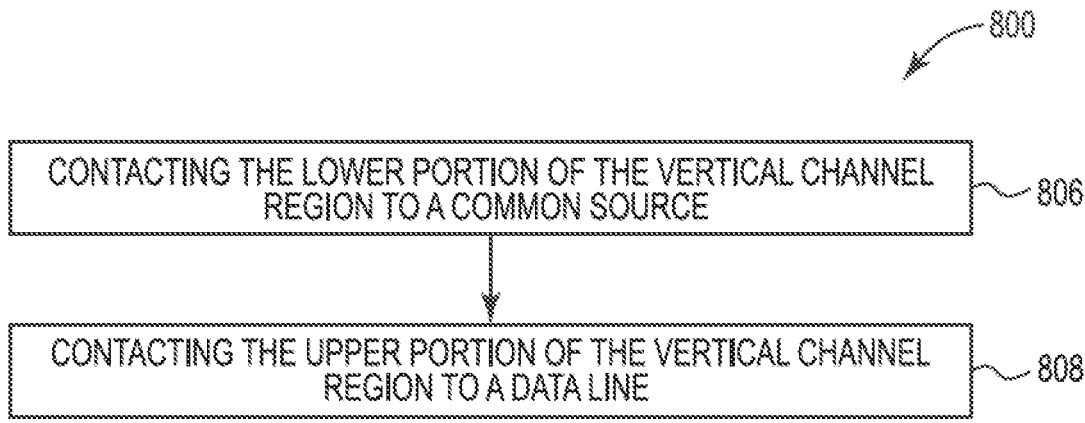

FIGS. 8A and 8B are flowcharts of a method 800 for fabricating a memory array in accordance with embodiments. Method 800 may correspond at least in part to FIGS. 7A-7R. As illustrated in FIG. 8A at 802, method 800 may include forming a string of series-connected memory cells (e.g., $206_0$ of FIG. 3) comprising control gates (e.g., 414 of FIG. 4D) comprising a first conductor (e.g., metal), a first gate stack structure (e.g., 450 of FIG. 4D), and a vertical channel region (e.g., 430 of FIG. 4C) along a lower portion of the vertical channel region. At 804, method 800 may include forming a plurality of series-connected select transistors (e.g., $212_{0,0}$ to $212_{0,2}$ of FIG. 3) comprising control gates (e.g., 415 of FIG. 4B) comprising a second conductor (e.g., polysilicon) different from the first conductor, a second gate stack structure (e.g., 420 of FIG. 4B) different from the first gate stack structure, and the vertical channel region (e.g., 430 of FIG. 4A) along an upper portion of the vertical channel region. In some embodiments, the lower portion of the vertical channel region might be horizontally offset with respect to the upper portion of the vertical channel region (e.g., as illustrated in FIG. 7R). Each memory cell of the string of series-connected memory cells might include a replacement gate stack structure (e.g., 450 of FIG. 4D). Each select transistor of the plurality of series-connected select transistors might include a barrier-engineered gate stack structure (e.g., 420 of FIG. 4B). As illustrated in FIG. 8B at 806, method 800 may further include contacting the lower portion of the vertical channel region (e.g., 742 of FIG. 7F) to a common source. At 808, method 800 may further include contacting the upper portion of the vertical channel region (e.g., 754 of FIG. 7O) to a data line, e.g., through an n-type conductively-doped polysilicon contact (e.g., 760 of FIG. 7O).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
   a string of series-connected memory cells comprising a vertical channel region, each memory cell of the string of series-connected memory cells comprising a first gate stack structure;
   a data line connected to the vertical channel region;
   a first select transistor connected between the data line and the string of series-connected memory cells;
   a common source;
   a second select transistor connected between the common source and the string of series-connected memory cells; and
   a gate leakage transistor connected between the first select transistor and the second select transistor, the gate leakage transistor comprising a second gate stack structure different from the first gate stack structure.

2. The memory device of claim 1, wherein the first gate stack structure comprises a replacement gate stack structure, and
   wherein the second gate stack structure comprises a barrier-engineered gate stack structure.

3. The memory device of claim 1, wherein the gate leakage transistor is configured to have a first leakage in response to a first electric field and a second leakage less than the first leakage in response to a second electric field less than the first electric field.

4. The memory device of claim 1, wherein a control gate of each memory cell of the string of series-connected memory cells comprises a metal gate, and
   wherein a control gate of the gate leakage transistor comprises a polysilicon gate.

5. The memory device of claim 1, wherein the gate leakage transistor is directly connected to the first select transistor.

6. The memory device of claim 1, further comprising:
   control logic configured to, during an erase operation of the string of series-connected memory cells:
     bias the data line and the common source to a first voltage level;
     bias a control gate of the first select transistor to a second voltage level less than the first voltage level;
     bias a control gate of the second select transistor to a third voltage level less than the first voltage level; and
     bias a control gate of the gate leakage transistor to a fourth voltage level greater than the first voltage level to inject holes from the control gate of the gate leakage transistor into the channel region.

7. The memory device of claim 5, further comprising:
a third select transistor connected between the gate leakage transistor and the string of series-connected memory cells.

8. The memory device of claim 7, further comprising:
control logic configured to, during an erase operation of the string of series-connected memory cells:
bias the data line and the common source to a first voltage level;
bias a control gate of the first select transistor to a second voltage level less than the first voltage level;
bias a control gate of the second select transistor to a third voltage level less than the first voltage level;
bias a control gate of the gate leakage transistor to a fourth voltage level greater than the first voltage level to inject holes from the control gate of the gate leakage transistor into the channel region; and
bias a control gate of the third select transistor to a fifth voltage level less than the second voltage level.

9. The memory device of claim 8, wherein the third voltage level is less than the second voltage level, and
wherein the fifth voltage level is between the second voltage level and the third voltage level.

10. A three-dimensional NAND memory array comprising:
a string of series-connected memory cells connected between a data line and a common source;
a semiconductor pillar providing a channel region of the string of series-connected memory cells;
a first select transistor connected between the data line and the string of series-connected memory cells;
a second select transistor connected between the common source and the string of series-connected memory cells; and
a gate leakage transistor connected between the first select transistor and the second select transistor, the gate leakage transistor configured to inject holes from a gate of the gate leakage transistor to the channel region during an erase operation of the string of series-connected memory cells.

11. The memory array of claim 10, wherein the gate leakage transistor comprises a barrier-engineered gate stack structure, and
wherein each memory cell of the string of series-connected memory cells comprises a replacement gate stack structure.

12. The memory array of claim 11, wherein the first select transistor comprises the barrier-engineered gate stack structure, and
wherein the second select transistor comprises the replacement gate stack structure.

13. The memory array of claim 10, further comprising:
a further gate leakage transistor connected between the first select transistor and the second select transistor, the further gate leakage transistor configured to inject holes from a gate of the further gate leakage transistor to the channel region during the erase operation of the string of series-connected memory cells.

14. The memory array of claim 10, wherein the semiconductor pillar providing the channel region is connected to the data line via a contact comprising an n-type conductively-doped polysilicon, and
wherein the semiconductor pillar providing the channel region comprises polysilicon.

15. The memory array of claim 10, wherein the semiconductor pillar providing the channel region is hollow.

16. A memory device comprising:
a string of series-connected memory cells connected between a data line and a common source, the string of series-connected memory cells comprising a channel region;
a first select transistor connected between the data line and the string of series-connected memory cells;
a second select transistor connected between the common source and the string of series-connected memory cells;
a gate leakage transistor connected between the first select transistor and the second select transistor; and
control logic configured to, during an erase operation of the string of series-connected memory cells:
bias the data line and the common source to a first voltage level;
bias a control gate of the first select transistor to a second voltage level less than the first voltage level to turn off the first select transistor;
bias a control gate of the second select transistor to a third voltage level less than the first voltage level to turn off the second select transistor; and
bias a control gate of the gate leakage transistor to a fourth voltage level greater than the first voltage level to charge the channel region to a positive potential.

17. The memory array of claim 16, further comprising:
a third select transistor connected between the gate leakage transistor and the string of series-connected memory cells.

18. The memory array of claim 17, further comprising:
a fourth select transistor connected between the second select transistor and the string of series-connected memory cells.

19. The memory array of claim 18, further comprising:
a fifth select transistor connected between the fourth select transistor and the string of series-connected memory cells.

20. The memory array of claim 19, wherein the gate leakage transistor comprises a barrier-engineered gate stack structure,
wherein each memory cell of the string of series-connected memory cells comprises a replacement gate stack structure;
wherein the first select transistor comprises the barrier-engineered gate stack structure;
wherein the second select transistor comprises the replacement gate stack structure;
wherein the third select transistor comprises the barrier-engineered gate stack structure;
wherein the fourth select transistor comprises the replacement gate stack structure; and
wherein the fifth select transistor comprises the replacement gate stack structure.

21. The memory array of claim 19, wherein the control logic is further configured to, during the erase operation of the string of series-connected memory cells:
bias a control gate of the third select transistor to a fifth voltage level less than the second voltage level and greater than the third voltage level;
bias a control gate of the fourth select transistor to a sixth voltage level less than the fifth voltage level and greater than the third voltage level; and
bias a control gate of the fifth select transistor to the sixth voltage level.

22. A method for fabricating a memory array, the method comprising:
forming a string of series-connected memory cells comprising control gates comprising a first conductor, a first gate stack structure, and a vertical channel region along a lower portion of the vertical channel region; and forming a plurality of series-connected select transistors comprising control gates comprising a second conductor different from the first conductor, a second gate stack structure different from the first gate stack structure, and the vertical channel region along an upper portion of the vertical channel region.

23. The method of claim 22, wherein the lower portion of the vertical channel region is horizontally offset with respect to the upper portion of the vertical channel region.

24. The method of claim 22, wherein each memory cell of the string of series-connected memory cells comprises a replacement gate stack structure, and wherein each select transistor of the plurality of series-connected select transistors comprises a barrier-engineered gate stack structure.

25. The method of claim 22, further comprising:

contacting the lower portion of the vertical channel region to a common source; and contacting the upper portion of the vertical channel region to a data line.

* * * * *